(12) United States Patent
Güdel et al.

(10) Patent No.: US 8,603,838 B2
(45) Date of Patent: Dec. 10, 2013

(54) METHOD FOR PRODUCING A CONTACT FOR SOLAR CELLS

(75) Inventors: Rudolf Güdel, Solothrun (CH); Marcel Blanchet, Niederglatt (CH); Roland Kappaun, Uhldingen-Muehlhofen (DE); Walter Zulauf, Gutenburg (CH); Rudolf Heid, Luterbach (CH); Hans-Ulrich Kurt, Kriegstetten (CH)

(73) Assignees: 3S Swiss Solar Systems AG, Lyss (CH); Guedel AG, Langenthal (CH)

( * ) Notice: Subject to any disclaimer, the term of this patent is extended or adjusted under 35 U.S.C. 154(b) by 364 days.

(21) Appl. No.: 12/990,267

(22) PCT Filed: Apr. 21, 2009

(86) PCT No.: PCT/CH2009/000124
§ 371 (c)(1),
(2), (4) Date: Dec. 8, 2010

(87) PCT Pub. No.: WO2009/132468
PCT Pub. Date: Nov. 5, 2009

(65) Prior Publication Data
US 2011/0111534 A1    May 12, 2011

(30) Foreign Application Priority Data
Apr. 30, 2008 (EP) .................................. 08405123

(51) Int. Cl.
*H01L 25/00* (2006.01)
*H01L 31/042* (2006.01)

(52) U.S. Cl.
USPC .............. 438/15; 136/256; 136/251; 136/244

(58) Field of Classification Search
USPC ................... 136/244, 252, 256, 251
See application file for complete search history.

(56) References Cited

U.S. PATENT DOCUMENTS 4,663,494 A * 5/1987 Kishi et al. ..................... 136/244
5,280,133 A * 1/1994 Nath .............................. 174/373
(Continued)

FOREIGN PATENT DOCUMENTS

EP    1411556 A1    4/2004

*Primary Examiner* — Andy Huynh
*Assistant Examiner* — David Goodwin
(74) *Attorney, Agent, or Firm* — Birch, Stewart, Kolasch & Birch, LLP.

(57) ABSTRACT

The invention relates to a method for producing a contact for solar cells (30) arranged in a laminated solar panel (1), wherein the solar cells (30) are coated on both sides of the main surfaces thereof with at least one layer and before a lamination step the solar cells (30) are connected with electrically-conducting connectors (31, 33), the electrically conducting connectors (31, 33) being arranged in the solar panel for laminating such as to be completely laminated within the solar panel (1) after the lamination step. After the lamination step a contact region (35) of the electrically-conducting connector (33) is exposed, wherein at least one of the layers covering the solar cells is completely punched through in the corresponding region, in particular by stripping. The contact region (35) of the electrically-conducting connector (33) can then be contacted by means of an externally-accessible contact element. The incorporation of the connector (31, 33) can be automated as the electrical connector (31, 33) can be laid essentially flat in the corresponding plane of the layer system and no complex through holes are made before lamination. The position of the electrical connector (31, 33) within the layer system is possible to be more accurately deigned than the position of connectors extending from the layer system which significantly simplifies contacting the contact region (35) of the connector (31, 33), in particular with an automated solution.

24 Claims, 3 Drawing Sheets

(56) References Cited

U.S. PATENT DOCUMENTS

| | | | |
|---|---|---|---|
| 5,489,888 A * | 2/1996 | Jagiella et al. | 340/537 |
| 5,567,248 A * | 10/1996 | Chung | 136/244 |
| 6,063,996 A * | 5/2000 | Takada et al. | 136/246 |
| 6,066,797 A * | 5/2000 | Toyomura et al. | 136/251 |
| 6,841,728 B2 * | 1/2005 | Jones et al. | 136/244 |
| 7,534,710 B2 * | 5/2009 | Katayama et al. | 438/594 |
| 7,915,518 B2 * | 3/2011 | Yuuki et al. | 136/251 |
| 2005/0274410 A1 * | 12/2005 | Yuuki et al. | 136/251 |
| 2006/0000504 A1 * | 1/2006 | Feldmeier et al. | 136/251 |
| 2008/0006321 A1 | 1/2008 | Munch et al. | |
| 2008/0053701 A1 | 3/2008 | Antaya et al. | |
| 2008/0083453 A1 * | 4/2008 | Rose et al. | 136/256 |
| 2009/0309683 A1 * | 12/2009 | Cochran | 336/65 |
| 2010/0294347 A1 * | 11/2010 | Zimmer et al. | 136/252 |
| 2011/0088746 A1 * | 4/2011 | Hong et al. | 136/244 |
| 2011/0111534 A1 * | 5/2011 | Gudel et al. | 438/15 |

* cited by examiner

METHOD FOR PRODUCING A CONTACT FOR SOLAR CELLS

TECHNICAL FIELD

The invention relates to a method for making a contact with solar cells which are arranged in a laminated solar panel, wherein the solar cells are covered on both sides of their main surfaces by in each case at least one layer. The invention also relates to a method for producing solar panels, to a solar panel and to an installation for producing laminated solar panels.

PRIOR ART

It is known for solar panels (also referred to as solar modules) to be constructed by electrically connecting a plurality of mechanically sensitive solar cells (photovoltaic cells, for example thick-film solar cells based on silicon) to one another, and enclosing them in a layer system. The layer system provides mechanical robustness and protects the enclosed cells against the influences of weather or adverse mechanical effects. The layer system may, for example, be based on a glass substrate, which is transparent for the relevant components of the solar radiation, or a rear-face film, between which the solar cells and the electrical connectors which connect them are enclosed. Films composed of EVA (ethylene vinyl acetate) or some other suitable material are introduced between the said layers, such that the layer system can be laminated together under the influence of heat and pressure. The solar cells may be surrounded by a frame.

A solar panel comprises electrical connections by means of which contact can be made from the outside with the solar cells which are electrically connected to one another within the layer system. In general, a plurality (or all) of the solar cells which are included in a module are connected in series, in order to allow sufficient output voltages. Furthermore, a solar module often has a plurality of circuits which can be tapped off individually, thus making it possible to draw current even when the module is partially shadowed. There are therefore three, four or even more connections, instead of two connections (in each case one for each polarity).

In known production methods for solar panels, some of the electrical connectors have been passed through the rear-face film to the outside in order to produce the electrical connections, before the lamination of the layer system. After lamination, it was then possible for these connecting elements, such as plugs or sockets, to be connected to these connecting lugs which are passed to the outside, for example by soldering.

The steps of producing the bushing for the connectors and the fitting of the connecting elements can in practice be carried out only manually. The connectors which are passed from the outside do not have a clearly defined position and make it harder to handle the solar panel to be produced. Automation correspondingly involves considerable difficulties, and the previous process is susceptible to errors. The overall production process for the solar panels is therefore expensive and complicated.

DESCRIPTION OF THE INVENTION

The object of the invention is to provide a method, associated with the technical field mentioned above, for making contact with solar cells, which method can be automated (to the greatest possible extent) and is less susceptible to errors.

The object is achieved as defined by the features of claim 1. According to the invention, the following steps are carried out in the course of the method: before a lamination step, which is carried out in the course of producing the solar panel, the solar cells are connected by electrically conductive connectors wherein the electrically conductive connectors are introduced into the solar panel to be laminated such that they are completely laminated in the solar panel after the lamination step. After the lamination step, a contact area of the electrically conductive connectors is exposed by completely penetrating, in particular removing, a corresponding area of at least one of the layers which cover the solar cells. Then, contact is made with the contact area of the electrically conductive connectors by means of a connecting element which can be tapped off from the outside.

The contact area of the connectors is therefore first of all laminated in and, after lamination, is completely enclosed by the surrounding layers. The contact area is then exposed again after lamination. There are two or more contact areas for each solar panel, depending on the number of circuits.

Since no complex bushings need be created before the lamination process, and the electrical connectors can be laid essentially flat in the corresponding plane of the layer system, the process of laying the connectors can be automated. Furthermore, the geometry of the connectors can be simplified. Since there are no passages through the individual layers of the layer system for the subsequent method steps, in particular for lamination, and since no connectors project out of the layer system, the layer system can be handled more easily in the subsequent method steps. Furthermore, the position of the electrical connectors within the layer system can be predetermined more precisely than the position of connector ends projecting out of the layer system, thus making it considerably easier to make contact with the contact area of the connectors, in particular in an automated solution.

Therefore, a solar panel produced using the method according to the invention has at least two layers which enclose a plurality of solar cells on both sides of their main surfaces, and the solar panel is constructed as follows:

a) the layers and the solar cells are laminated together;
b) the solar cells are connected to one another by electrically conductive connectors which are located completely within the layers;
c) the electrically conductive connectors comprise a contact area which is located within the layers;
d) access is provided to the contact area, which access passes through at least one layer which covers the contact area; and
e) a connecting element which can be tapped off from the outside is passed through the access and is electrically connected, in particular welded or soldered, to the connector in its contact area.

A panel such as this can be produced by a method having the following steps:

a) provision of a basic substrate, in particular of a glass plate;
b) fitting of a first laminate film to the basic substrate, in particular a film composed of EVA;
c) connection of a plurality of solar cells by means of electrically conductive connectors;
d) fitting of the solar cells to the first laminate film;
e) fitting of a second laminate film to the solar cells, in particular a film composed of EVA;
f) fitting of a rear-face layer to the second laminate film in order to produce the still unlaminated solar panel;
g) lamination of the unlaminated solar panel;
h) exposure of a contact area of the electrically conductive connectors by completely penetrating, in particular removing, a corresponding area of the rear-face layer and the connecting layer which is created from the second laminate film;

i) making contact with the contact area of the electrically conductive connectors by means of a connecting element which can be tapped off from the outside.

In this case, the basic substrate preferably forms the lowermost layer during processing, although it is also feasible within the scope of the invention to work in the opposite sequence, that is to say by providing the basic substrate as the uppermost layer, or by rotating the partially constructed layer system one or more times during processing. Any desired sequence may be chosen for the electrical connection of the solar cells (step c) and for the fitting of the solar cells to the first laminate film (step d).

A suitable installation comprises:

a) a station for connecting solar cells by electrically conductive connectors;
b) a station for building a solar panel to be laminated, wherein the solar cells and the electrically conductive connectors are covered by in each case at least one layer on both sides of their main surfaces;
c) a device for laminating the solar panel;
d) a device, in particular a milling machine, for exposure of a contact area of the electrical connectors which are laminated in the solar panel, by completely penetrating, in particular removing, a corresponding area of at least one of the layers which cover the solar cells; and
e) a device, in particular a soldering or welding station, for making contact with the contact area of the electrically conductive connectors by means of a connecting element which can be tapped off from the outside.

The stations and devices mentioned advantageously operate completely automatically. However, embodiments are also feasible in which some of the stations and/or devices are semi-automatic or manual.

Therefore, the contact area is advantageously exposed by milling. A processing step such as this can be automated easily, allows high precision and allows the affected layers of the laminated layer system as well as the electrical connectors to be processed carefully. The process of free milling furthermore creates a clean surface for the subsequent connection process, in the contact area of the connector. During milling, the processing point is advantageously cooled by air, and the swarf that is created is also sucked away. The milling tool is advantageously designed such that the swarf is as short as possible.

Other types of processing, for example cutting, stamping or melting on, are in principle also feasible.

Before the exposure of the contact area, a position of the electrically conductive connectors, in particular a location and a depth, are advantageously measured. For this purpose, in an appropriate installation, a device for measuring a position of the electrically conductive connectors is preferably arranged in the sequence before the device for exposure of the contact area. The previous position measurement allows precise exposure and reliable contact to be made with the contact area. In particular, this is indicated because, in the case of conventional laminates, the completely laminated-in connectors "float" in the adjacent laminating film layer and therefore do not retain their position precisely during the lamination process. The determination of the location allows precise positioning of the processing tool for exposure of the contact area; determination of the depth makes it possible to set a precise processing depth, and therefore ensures that the contact area is actually exposed while ensuring at the same time no damage to or excessive adverse effect on the electrically conductive connectors occurs.

The milling process can be carried out by means of a commercially available computer-controlled milling head. The detector for the location of the contact areas and the milling tool are advantageously fitted to the same head thus making it possible to achieve a simple design and high processing precision. First of all, the milling points to be processed are measured, after which the milling process is carried out. If a plurality of contact areas have to make contact with contact elements which are in a fixed predetermined relative layout, the individual milling depths and the individual location of the layout of the contact points are then set on the basis of the measured values.

The position of the electrically conductive connectors is preferably measured by means of an inductive sensor. A sensor such as this costs relatively little, and it is has also been found that a sensor such as this allows both the lateral position of the laminated-in connectors and their depth to be determined precisely in one process, in which case the results are not disturbingly influenced by the surrounding layers in the layer sequence. By way of example, a commercially available inductive sensor with an analog current output is moved over the approximately expected position of the contact areas of the electrically conductive connectors. The lateral location of the connector can then be determined by detection of the minimum current, and the depth by the absolute value of the minimum current.

Sensors are also feasible which are based on a different principle, for example ultrasound or X-ray sensors, or mechanical (probe) sensors. Capacitive sensors do not appear to be very suitable because the measurement results are significantly influenced by the characteristics of the surrounding layers.

Before the lamination step, the electrically conductive connectors can be provided with a material reinforcement in their contact area, that is to say the amount of material in the contact area is increased. In addition, in an exposure process, in which the material of the connector is partially removed in order to ensure that a reliable contact is made (for example during a milling process), this ensures that the remaining cross section of the connector is adequate for the currents to be carried. The material reinforcement may, for example, be achieved by doubling the connector (particularly if the connector is in the form of a ribbon), that is to say a free end of the connector is bent around in order to double the material cross section; the section which has been bent around is then preferably connected to the section located above or below it, for example by soldering. Instead of doubling, a different method can also be used to increase the amount of material, for example compression, or an additional element is used.

The material reinforcement is advantageously produced even before the solar cells are connected, that is to say those connectors which require reinforcement are prefabricated in advance. This allows the processing process to be kept simple.

Alternatively, the reinforcement, for example with bending around to produce doubling, is carried out only after the solar cells have been connected.

Instead of a material reinforcement, it is possible, for example, to enlarge the entire cross section of the electrical connector, or a method for exposure is used in which the cross section is not reduced.

The electrically conductive connectors are advantageously arranged such that all the contact areas are located in an edge area of the solar panel, and in particular adjacent to one another. This allows a simpler connector layout and, furthermore, there is no need for additional insulation in the area of the connection, from solar cells located underneath it. In addition, there is no risk of solar cells being damaged by mechanical and/or thermal influences during exposure of the contact areas.

Alternatively, the connection is made in the area of the solar cells. This requires additional insulation and a method for exposure in which there is no risk of damage to solar cells. For this purpose, the ratio of the cell area to the total area can be increased, resulting in a higher area efficiency.

The electrically conductive connectors which are located in the edge area may be arranged on an additional common mount in the area of the contact areas, that is to say on a mount which is not part of the layer sequence and which is present only in the area of the contact areas. By way of example, a ribbon composed of polyvinyl fluoride (Tedlar) is suitable for use as a mount. The mount and, if appropriate, the connectors to be arranged in the area of the mount, can be prefabricated together with the contact areas, thus simplifying the processing. Furthermore, the mount separates the connectors located behind it from the front face of the solar panel, thus protecting the connectors against possible damaging influences, such as solar radiation, and thus improving the aesthetics of the solar panel. Furthermore, the mount creates a thermal barrier from the layer located in front of it, and thus prevents damage thereto when the connecting element is connected, for example by welding or soldering, to the contact area of the electrically conductive connectors.

Alternatively, the connectors are placed only on the surrounding layers.

The solar cells are connected to one another by means of longitudinal connectors to form strands, and various of the strands are electrically connected by means of lateral connectors, wherein the contact areas are formed on the lateral connectors. A simple layout is achieved thereby. A particularly simple layout is obtained by both the longitudinal connectors and the lateral connectors being straight and being arranged at right angles to one another. Because of the currents that have to be carried, the lateral connectors have a larger cross section than the longitudinal connectors. Safe and long-life contact areas can therefore be formed more easily on the lateral connectors than on the comparatively thin longitudinal connectors. In particular, the lateral connectors can be arranged in the edge area of the solar panel, and if required on an additional mount.

Alternatively, different layouts can be used.

The plurality of solar cells are advantageously connected by means of electrically conductive connectors before the solar cells are fitted to the first laminate film. This ensures that the laminate film is not adversely affected by the connection process (in particular by soldering). Even before being placed in position, the strands that are produced and/or the entire layouts can also be electrically tested, for example by means of a so-called dark-current test.

A connection without flux is preferably used to connect the longitudinal connectors to the lateral connector or the lateral connectors, and/or to make contact with the contact area of the electrically conductive connectors, by means of the connecting element which can be tapped off from the outside. Excess flux evaporates and reacts with the material of the laminate films (that is to say for example EVA) thus creating an upper limit for the operating temperature for the polymerization process. Longer lamination times are required, corresponding to the lower operating temperature. If there is no need to use a flux, for example by using a wire bonding method and there is correspondingly no reaction with the laminate material, the economy of the method can be considerably improved because of the considerably shorter lamination times.

The connecting element which can be tapped off from the outside is advantageously arranged in a connecting box is fitted to a rear face of the laminated solar panel, in order to make contact between the contact area of the electrically conductive connectors and a first main surface. The connecting box protects the contact points with the electrical connectors, and provides a robust and permanent connection capability.

For the purposes of one preferred embodiment, the connecting element is (mechanically) attached at a first end to the connecting box, and is designed to be sprung at its second, free end, such that the sprung end makes contact with the contact area after the connecting box has been fitted. The sprung end is then connected, in particular welded or soldered, to the contact area. The sprung embodiment of the connecting elements ensures compensation for tolerances between the connecting elements and the corresponding contact areas.

Preferably, the connecting element is arranged in the area of an opening which passes through the connecting box, such that, in order to connect the connecting element to the contact area, a connecting tool can be moved from a rear face to the connecting element. Because the contact area is still accessible directly from the rear even after the connecting box has been placed in position, automation of the connection step is greatly simplified. Once the box has been placed in position and the free end has been connected, the opening is preferably encapsulated with the contact area. The encapsulation immobilizes the elements which have been connected to one another, and ensures long-term protection of the contact points.

The electrically conductive connectors are like ribbons at least in the contact area and they are fitted essentially flat between the layers of the solar panel, that is to say the main surfaces of the ribbon-like connectors are parallel to the main surfaces of the individual layers in the layer sequence. Ribbon-like connectors make it possible to achieve cross sections which are adequate for the currents to be carried, while at the same time avoiding the connectors being applied too strongly and, for example, being able to adversely influence the uniform lamination of the layer system.

Further advantageous embodiments and feature combinations of the invention will become evident from the following detailed description and from all of the patent claims.

BRIEF DESCRIPTION OF THE DRAWINGS

In the drawings which are used to explain the exemplary embodiment.

In principle, the same parts are provided with the same reference symbols in the figures.

APPROACHES TO IMPLEMENTATION OF THE INVENTION

Figure 1:
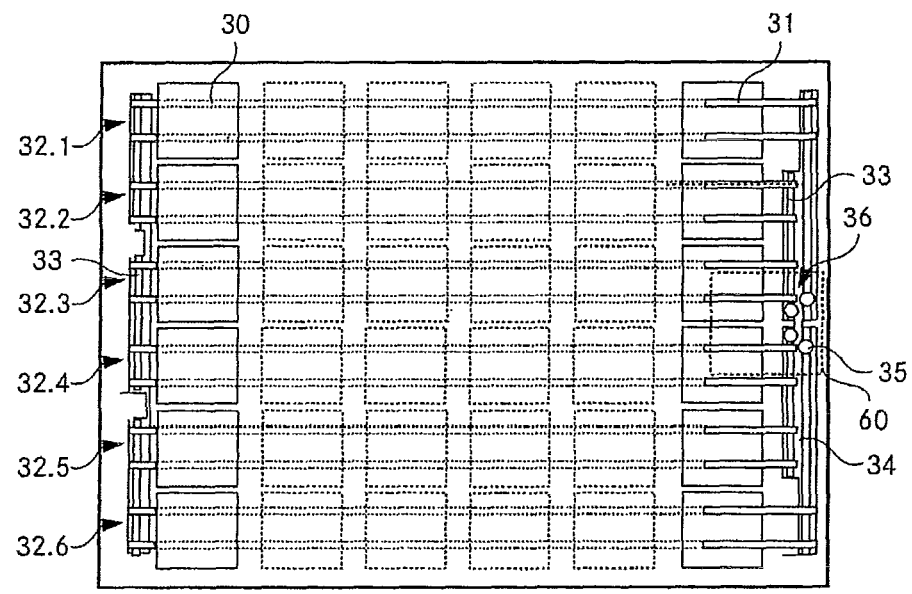
FIG. 1 shows a schematic illustration of a plan view of a solar panel according to the invention.
Figure 2:
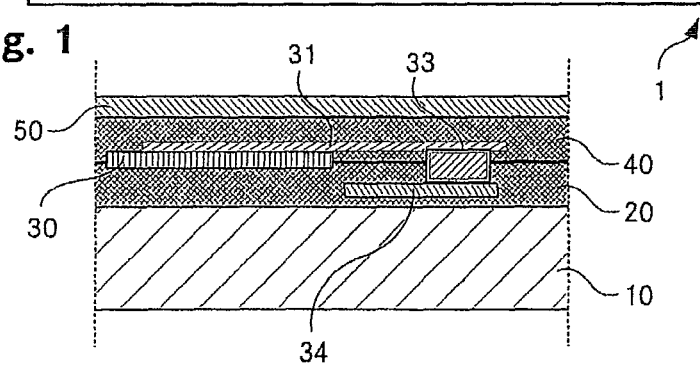
FIG. 2 shows a schematic illustration of a cross section through the solar panel.

FIG. 1 shows a schematic illustration of a plan view of a solar panel according to the invention. FIG. 2 shows a schematic illustration of a cross section through the solar panel. The solar panel 1 has a glass plate 10 composed of single-pane safety glass as the basic substrate. A layer system is formed on this glass plate 10, consisting of a first transparent plastic layer 20 composed of ethylene vinyl acetate (EVA), a plurality of solar cells 30, which are known per se, a second plastic layer 40 composed of ethylene vinyl acetate (EVA) and a rear-face film 50 composed of polyester. The solar panel 1 is arranged (for example mounted on a building roof) such that the glass plate faces the sun. The solar radiation passes through the glass plate 10 and the first transparent plastic layer 20 and strikes the solar cells 30 which are embedded between the plastic layers 20, 40, where the electrical voltage is produced.

A plurality of the solar cells 30 (six in each case in the illustrated example) are in each case connected in series by longitudinal connectors 31 to form a plurality (in the illustrated example, six) of strands 32.1 ... 32.6. The corresponding connections are in some cases merely indicated in FIG. 1 (dashed lines). For this purpose, the longitudinal connectors 31 are soldered to contact surfaces of the solar cells 30. Each two of the strands 32.1, 32.2; 32.3, 32.4 and 32.5, 32.6 are in turn connected to one another in series, with the connection being created by lateral connectors 33. The circuit illustrated in FIG. 1 has four taps (see below), with the two first interconnected strands 32.1, 32.2 being connected between a first and a second tap, the third and the fourth strands 32.3, 32.4 which are connected to one another being connected between the second and a third tap, and the fifth and the sixth strands 32.5, 32.6 which are connected to one another being connected between the third tap and a fourth tap. It is therefore possible to specifically tap off all the solar cells 30 or individual areas of the solar panel 1.

The lateral connectors 33 which have been mentioned are tinned 5×0.4 mm copper ribbons. The tin layer in this case has a thickness of about 20 μm. The cross section is chosen such that the maximum currents to be expected can be carried. The lateral connectors 33 are arranged in two opposite edge areas of the solar panel 1 and run essentially at right angles to the longitudinal connectors 30, with the main surfaces of the lateral connectors 33 being parallel to the main surfaces of the individual layers of the layer system. The lateral connectors 33 are mounted on a mount ribbon 34 composed of polyvinyl fluoride (Tedlar) by means of a layer of EVA. In one of the mutually opposite edge areas of the solar panel, each of the four lateral connectors 33, which are each arranged in one half of the solar panel 1, has a contact area 35 in the area of one free end, with the contact areas 35 providing the taps as mentioned above, and with the contact areas 35 being arranged adjacent to one another such that the four contact areas 35 form a trapezoidal contact quadrilateral 36. The solar cells 30, the longitudinal connectors 31 and the mount ribbons 34 with the lateral connectors 33 are all encapsulated between the two plastic layers 20, 40. In the case of the contact areas 35, that is to say at the corresponding free ends, the lateral connectors 33 are bent around over a length of 12 mm, and the bent-around end is soldered, thus doubling the cross section of the lateral connectors 33 in the contact areas.

A connecting box 60 is placed on the rear face of the solar panel 1, which connecting box 60 has connecting elements which can be connected to the contact areas 35 of the lateral connector 33 (see below, FIGS. 6 and 7). Freewheeling diodes are arranged in the connecting box 60 and, in a manner which is known per se, prevent the output voltage from collapsing when, for example, the solar panel is partially shadowed, by, so to speak "masking out" shadowed areas. Furthermore, the solar panel 1 can be provided with a frame, for example composed of aluminum (not illustrated).

Figure 8:
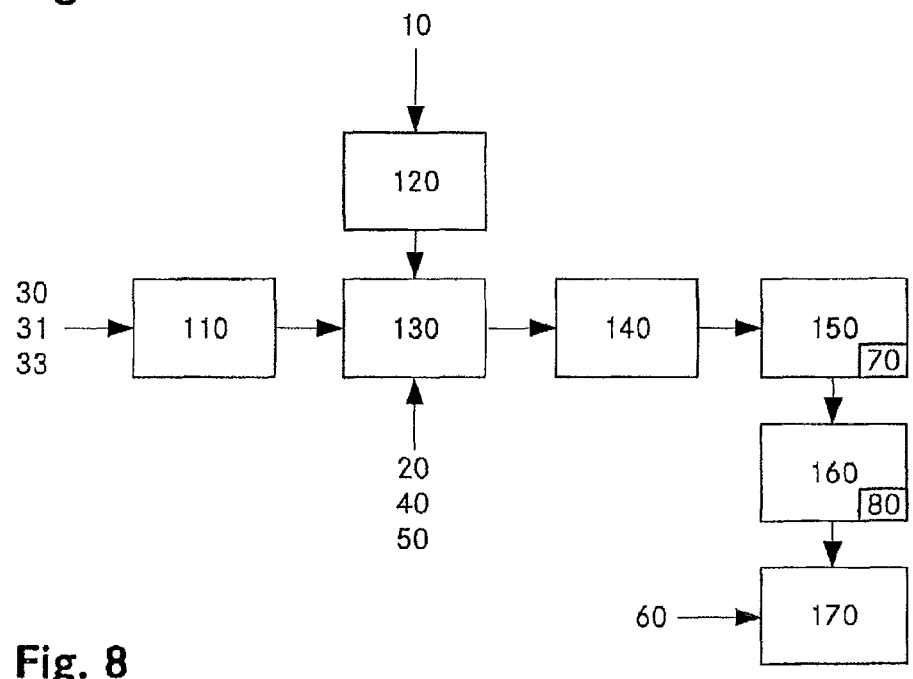
FIG. 8 shows a block diagram of an installation according to the invention for production of solar panels.

The production of the solar panel 1 will be described in the following text. FIG. 8 shows a block diagram of an installation which is suitable for this purpose. In order to manufacture the solar panel 1, the glass plate 10 is first of all cleaned, and is prepared for the further method steps (station 120). In a further station 110, the solar cells 30 are first of all connected to the longitudinal connectors 31 to form strands 32.1 ... 32.6, and the strands are then interconnected by means of the lateral connectors 33. In a further station 130, the layer system is then placed step-by-step on the glass plate 10, that is to say a first plastic film composed of EVA to form the first plastic layer 20, the interconnected solar cells 30 together with the longitudinal and lateral connectors 31, 33, a second plastic film to form the second plastic layer 40, and the rear-face film 50 are placed on the glass plate. The module is then laminated in a lamination device 140 at a reduced pressure and at about 150° C. During the lamination process, clear, three-dimensionally crosslinked plastic layers 20, 40, which can no longer be melted, are formed from the EVA plastic films, which until then have been milky, in which plastic layers 20, 40 the solar cells 30 and the connectors are now embedded, and which are connected firmly to one another and to the glass plate 10 and the rear-face film 50. After the lamination process, the edges are hemmed, and the connecting box 60 is placed in position and is fitted with the freewheeling diodes. The solar panel 1 is now also framed, is measured, and is classified on the basis of its electrical values, and is packaged.

Figure 3:
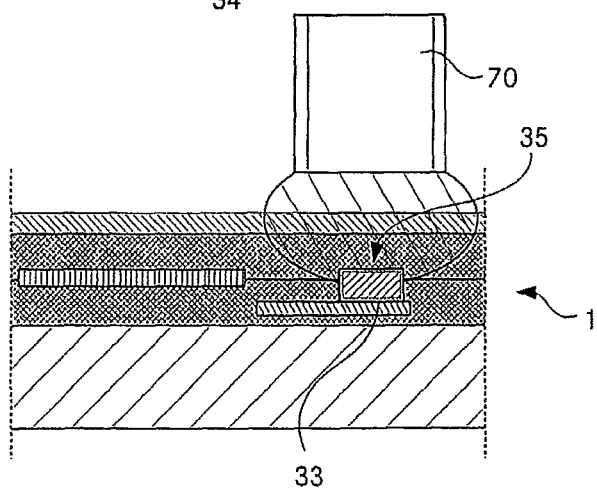
FIG. 3 shows a schematic cross-sectional illustration of how the location of a contact area is determined.

The process of making contact with the contact areas of the lateral connectors, according to the invention, will now be described with reference to FIGS. 3-6. FIG. 3 shows a schematic cross-sectional illustration of how the location of a contact area 35 is determined in a corresponding measurement device 150. For this purpose, an inductive sensor 70, for example an analog sensor of the IWRM 12 type from Baumer Electric, Frauenfeld, Switzerland, is passed at a measurement distance of 0-4 mm over the rear face of the already laminated solar panel 1, and the output current is measured at various positions. In addition to said analog sensor, the measurement device has a power source (24 V direct current), an appropriately selected load resistance and a multimeter which has adequate resolution in the resultant output current range (in this case 4 ... 20 mA). It has been found that good results are obtained with the sensor being at a distance of 1.6 mm from the rear-face film. In order to ensure an unambiguous reference between the position measurement and the subsequent milling process, which will be described further below, the sensor is attached to the milling spindle support via a dial test indicator holder, with the sensor being set back by 1.0 mm from the milling tool tip. In the described exemplary embodiment, all that is necessary is to determine the lateral position of the lateral connectors 33, since longitudinal movement along the extent of the lateral connectors 33 is not critical.

If the sensor 70 is moved laterally with respect to the lateral connector 33, the position at which a minimum output current is measured corresponds to the center of the lateral connector 33. Furthermore, the depth of the lateral connector 33 can be deduced from the absolute value of the minimum output current. The sensor 70 is regularly calibrated in order to ensure that the depth can always be determined reliably. This can be done using control measurements from processed solar panels and/or measurements on predetermined patterns. The measurement is repeated for all four contact areas 35, as a result of which four lateral positions and four depths are determined. Once the four lateral positions have been determined, a mean value is determined, which later makes it possible to position a contact quadrilateral such that contact can be made reliably with all the lateral connectors 33. The measured values are stored for the next process step.

Figure 4:
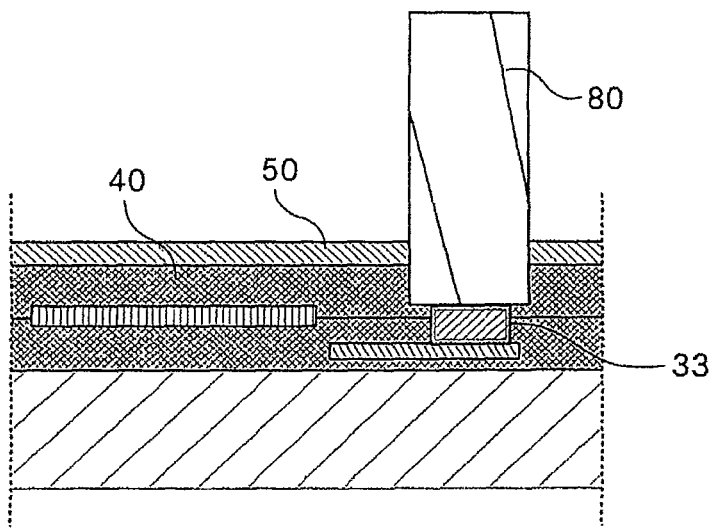
FIG. 4 shows a schematic cross-sectional illustration of the exposure of a contact area.

FIG. 4 shows a schematic cross-sectional illustration of the exposure of a contact area. For this purpose, a milling tool 80, which is attached to a milling spindle support, which is known per se, of a milling device 160 is passed, at the predetermined position, through the rear-face film 50 and the rear plastic layer 40 as far as the lateral connector 33, with the layers that have been mentioned and the tin layer on the lateral connector 33 being removed in this area. The doubling of the lateral connectors 33 in their end area ensures that an adequate cross section for carrying the currents to be expected is still available after the tin layer has been completely removed. In the illustrated exemplary embodiment, the milling tool 80 is an HSS two-flute cutter, which is operated at a high rotation speed. The milling tool 80 is designed to form swarf which is as short as possible.

During the milling process, the processing point is cooled with air. The milling depth is chosen—depending on the measured depth of the contact point—such that the tin layer on the lateral connector 33 is reliably removed, but such that the remaining cross section of the lateral connector 33, which has been doubled in this section, is still sufficient to carry the maximum current to be expected. The four milling points are laid out with a fixed geometric relationship to one another, and the contact quadrilateral is positioned relative to the solar panel 1 on the basis of the measurements carried out in the previous step.

Figure 5:
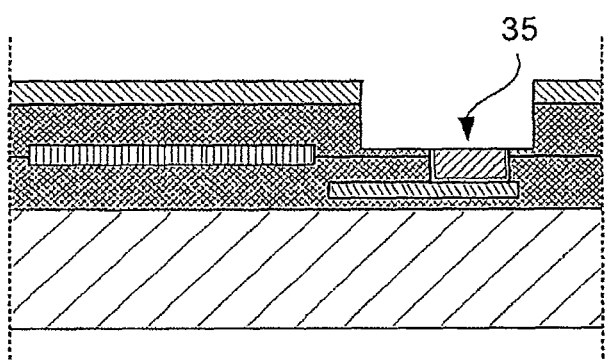
FIG. 5 shows a schematic cross-sectional illustration of an exposed contact area.

FIG. 5 shows a schematic cross-sectional illustration of the contact area 35, which is now exposed.

Figure 6:
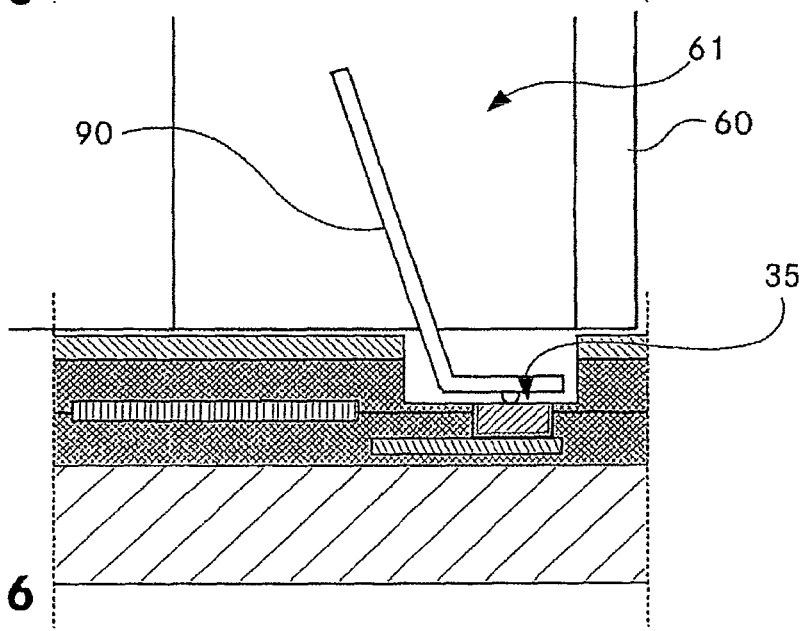
FIG. 6 shows a schematic cross-sectional illustration of how contact is made with the contact area.
Figure 7:
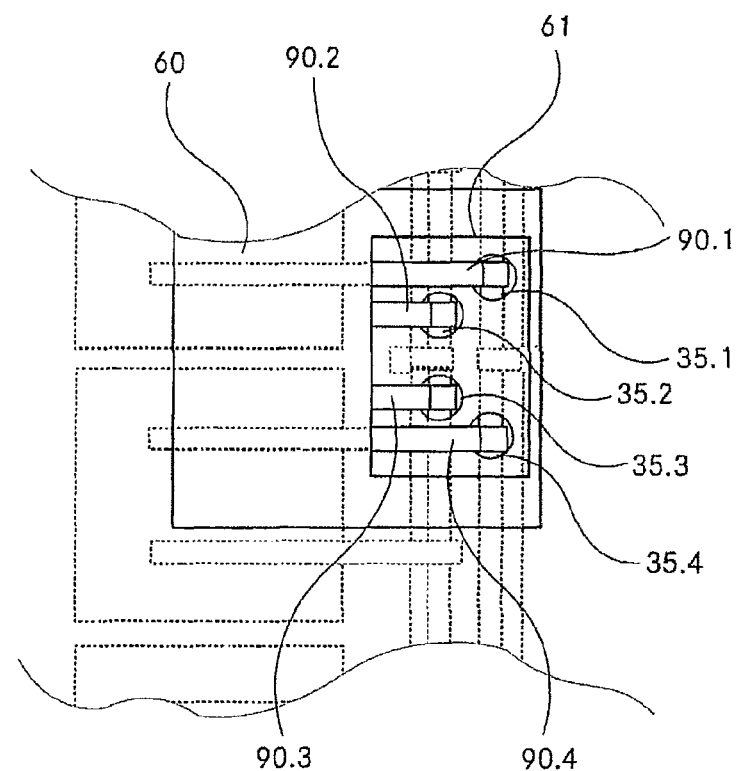
FIG. 7 shows a schematic plan view of the rear face of the solar panel and of the connecting box.

FIG. 6 shows a schematic cross-sectional illustration of how contact is made with the contact area 35 in an appropriate station 170. FIG. 7 shows a schematic plan view of the rear face of the solar panel and of the connecting box. Once the contact areas 35, 35.1 . . . 35.4 have been exposed, sprung connecting lugs 90, 90.1 . . . 90.4 are placed with their free ends, which have been bent to the horizontal, on the contact areas 35, 35.1 . . . 35.4. The free end can then be soldered to the contact area 35, 35.1 . . . 35.4. The free ends of the connecting lugs 90, 90.1 . . . 90.4 are positioned in an opening 61, which passes all the way through the connecting box 60 from back to front, in such a way that the soldering tool can access the connecting lugs 90, 90.1 . . . 90.4 from the rear through this opening 61. After all four connecting lugs 90, 90.1 . . . 90.4 have been soldered, the opening 61 can be encapsulated with a suitable encapsulation means.

The invention is not restricted to the described exemplary embodiment. For example, the layout of the solar cells, of the connectors and of the contact surfaces may be chosen to be different. In addition, the materials mentioned should be understood only as exemplary embodiments, for example other materials such as silicone rubber can be used instead of the layers of EVA. The rear-face coating can also be produced from a different material, for example from polyvinyl fluoride (Tedlar). In addition, the basic substrate need not be a glass plate but can, for example, be manufactured from a plastics material. The invention can be used in conjunction with most commercially available solar cells, and in particular both with monocrystalline and polycrystalline cells.

Instead of doubling the free ends of the lateral connectors, it is also possible to use lateral connectors with a somewhat larger cross section, as a result of which an adequate cross section for carrying the maximum currents to be expected is also provided after the contact area has been exposed. Instead of a soldered joint between the connecting lugs and the contact areas of the lateral connectors, a welded joint can also produced, or a wire-bonding method, which is known per se, can be used.

In addition, the connecting box can be designed differently and, for example, it is possible to form the contact elements by means of contact pieces that are supported via helical springs, or for the (initial) contact not to be made by a spring, but to be made only by the external tool during the connection process.

In summary, it can be stated that the invention provides a method for making contact with solar cells, which method can be automated and is less susceptible to errors.

The invention claimed is:

1. A method for making contact with solar cells which are arranged in a laminated solar panel, wherein the solar cells are covered on both sides of their main surfaces by in each case at least one layer comprising the following steps:
   a) before a lamination step, connection of the solar cells by electrically conductive connectors;
   b) wherein the electrically conductive connectors are introduced into the solar panel to be laminated such that they are completely laminated in the solar panel after the lamination step;
   c) laminating the electrically conductive connectors in between said layers on both sides of the main surfaces of the connectors;
   d) after the lamination step, exposure of a contact area of the electrically conductive connectors by completely penetrating a corresponding area of at least one of the layers which cover the solar cells;
   e) measuring a location, including a lateral position of the electrically conductive connectors, and a depth of the electrically conductive connectors before the exposure of the contact area; and
   f) making contact with the contact area of the electrically conductive connectors using a connecting element which can be tapped off from the outside.

2. The method as claimed in claim 1, whereas the measurement is carried out using an inductive sensor.

3. The method as claimed in claim 1, whereas the contact area is exposed by milling.

4. The method as claimed in claim 1, whereas the electrically conductive connectors are arranged such that all the contact areas are located in an edge area of the solar panel, and in particular adjacent to one another.

5. The method as claimed in claim 4, whereas the electrically conductive connectors are arranged on an additional common mount in the area of the contact areas.

6. The method as claimed in claim 1, whereas the solar cells are connected to one another by means of longitudinal connectors to form strands, and in that various of the strands are electrically connected by means of lateral connectors, wherein the contact areas are formed on the lateral connectors.

7. The method as claimed in claim 6, whereas the longitudinal connectors are connected to the lateral connector, and/ or contact is made with the contact area of the electrically conductive connectors, by the connecting element which can be tapped off from the outside, by means of a connection without flux.

8. The method as claimed in claim 1, whereas the connecting element which can be tapped off from the outside is arranged in a connecting box, wherein the connecting box is fitted to a rear face of the laminated solar panel, in order to make contact between the contact area of the electrically conductive connectors and a first main surface.

9. The method as claimed in claim 8, whereas the connecting element is attached at a first end to the connecting box, and in that the connecting element is designed to be sprung at its second, free end, such that the sprung end makes contact with the contact area after the connecting box has been fitted, wherein the sprung end is then connected to the contact area.

10. The method as claimed in claim 9, whereas the connecting element is arranged in the area of an opening which passes through the connecting box, such that, in order to connect the connecting element to the contact area, a connecting tool can be moved from a rear face to the connecting element.

11. The method as claimed in claim 1, whereas the electrically conductive connectors are like ribbons at least in the contact area and they are fitted essentially flat between the layers of the solar panel.

12. A method for producing solar panels, comprising the following steps:
   a) provision of a basic substrate;
   b) fitting of a first laminate film to the basic substrate;
   c) connection of a plurality of solar cells by means of using electrically conductive connectors;
   d) fitting of the solar cells to the first laminate film;
   e) fitting of a second laminate film to the solar cells;
   f) fitting of a rear-face layer to the second laminate film in order to produce the still unlaminated solar panel;
   g) lamination of the unlaminated solar panel, such that the electrically conductive connectors are completely laminated in the solar panel after the lamination step;
   h) measurement of a location, including a lateral position of the electrically conductive connectors, and a depth of the electrically conductive connectors;
   i) exposure of a contact area of the electrically conductive connectors by completely penetrating a corresponding area of the rear-face layer and a connecting layer which is created from the second laminate film;
   j) making contact with the contact area of the electrically conductive connectors by means of a connecting element which can be tapped off from the outside.

13. The method as claimed in claim 12, whereas the plurality of solar cells are connected by means of electrically conductive connectors before the solar cells are fitted to the first laminate film.

14. An installation for producing laminated solar panels, comprising
   a) a station for connecting solar cells by electrically conductive connectors;
   b) a station for building a solar panel to be laminated, wherein the solar cells and the electrically conductive connectors are covered on both sides of their main surfaces by in each case at least one layer;
   c) a device for laminating the solar panel;
   d) a device for measuring a location and a depth of the electrically conductive connectors;
   e) a device for exposure of a contact area of the electrical connectors which are laminated in the solar panel, by completely penetrating a corresponding area of at least one of the layers which cover the solar cells; and
   f) a device for making contact with the contact area of the electrically conductive connectors by means of a connecting element which can be tapped off from the outside.

15. The method as claimed in claim 1, whereas the contact area of the electrically conductive connectors is exposed by removing the corresponding area of said at least one of the layers.

16. The method as claimed in claim 9, whereas the sprung end is welded or soldered to the contact area.

17. The method as claimed in claim 10, comprising the further step of encapsulating the opening after the connecting box has been fitted and the free end has been connected to the contact area.

18. The method as claimed in claim 12, whereas the basic substrate is a glass plate.

19. The method as claimed in claim 12, whereas the first laminate film is a film composed of EVA.

20. The method as claimed in claim 12, whereas the second laminate film is a film composed of EVA.

21. The method as claimed in claim 12, whereas the contact area of the electrically conductive connectors is exposed by removing the corresponding area of said at least one of the layers.

22. An installation as claimed in claim 14, whereas the device for exposure of a contact area is a milling machine.

23. An installation as claimed in claim 14, whereas the device for exposure of a contact area is capable of removing the corresponding area of said at least one of the layers.

24. An installation as claimed in claim 14, whereas the device for making contact with the contact area is a soldering or welding station.

* * * * *

UNITED STATES PATENT AND TRADEMARK OFFICE
CERTIFICATE OF CORRECTION

PATENT NO.       : 8,603,838 B2                                     Page 1 of 1
APPLICATION NO.  : 12/990267
DATED            : December 10, 2013
INVENTOR(S)      : Rudolf Güdel et al.

It is certified that error appears in the above-identified patent and that said Letters Patent is hereby corrected as shown below:

ON THE TITLE PAGE:

At item (75), Inventors, change:

"Rudolf Güdel, Solothrun (CH)" to --Rudolf Güdel, Solothurn (CH)--.

Signed and Sealed this
Second Day of September, 2014

Michelle K. Lee
*Deputy Director of the United States Patent and Trademark Office*